United States Patent [19]

Brown et al.

[11] Patent Number: 5,013,248
[45] Date of Patent: May 7, 1991

[54] MULTICIRCUIT CONNECTOR ASSEMBLY

[75] Inventors: Thomas E. Brown, Mechanicsburg; Thomas F. Davis, Camp Hill, both of Pa.

[73] Assignee: AMP Incorporated, Harrisburg, Pa.

[21] Appl. No.: 444,577

[22] Filed: Nov. 30, 1989

Related U.S. Application Data

[63] Continuation-in-part of Ser. No. 407,762, Sep. 19, 1989.

[51] Int. Cl.⁵ .............................................. H01R 9/09
[52] U.S. Cl. ....................................... 439/66; 29/883; 439/591
[58] Field of Search ...................... 439/66, 71, 86, 91, 439/586, 591, 931; 29/883, 885; 200/262-269

[56] References Cited

U.S. PATENT DOCUMENTS

| 3,042,591 | 7/1962 | Cado | 204/15 |
| 3,629,185 | 12/1971 | Schneble, Jr. et al. | 260/40 |
| 3,795,884 | 5/1974 | Kotaka | 439/66 |
| 3,851,297 | 11/1974 | Munro | 439/637 |
| 3,907,621 | 9/1975 | Polichette et al. | 156/18 |
| 3,930,963 | 1/1976 | Polichette et al. | 204/15 |
| 3,991,463 | 11/1976 | Squitieri | 29/883 |
| 3,993,802 | 11/1976 | Polichette et al. | 427/98 |
| 3,994,727 | 11/1976 | Polichette et al. | 96/38.4 |
| 4,003,621 | 1/1977 | Lamp | 439/591 |
| 4,287,253 | 9/1981 | Leech | 428/323 |
| 4,511,597 | 4/1985 | Teng et al. | 427/53.1 |
| 4,529,257 | 7/1985 | Goodman et al. | 339/94 |
| 4,532,152 | 7/1985 | Elarde | 427/96 |
| 4,594,311 | 6/1986 | Frisch et al. | 430/315 |
| 4,604,799 | 8/1986 | Gurol | 29/897 |
| 4,666,226 | 5/1987 | Legrand et al. | 29/883 |
| 4,737,118 | 12/1988 | Lockard | 439/289 |
| 4,754,546 | 6/1988 | Lee et al. | 439/586 |
| 4,820,170 | 4/1989 | Redmond et al. | 439/66 |
| 4,902,235 | 2/1990 | Tonooka | 29/883 |

FOREIGN PATENT DOCUMENTS 1020550 8/1986 European Pat. Off. .

OTHER PUBLICATIONS

O'Brien, Jack, "Cast Spring"-A Plated, Molded Thermoplastic Electrical I/O Interface, *Connection Technology*, vol. 5, No. 6, Jun. 1989, pp. 23-27.
IBM Bulletin, Ujifusa, vol. 14, No. 7, p. 1988, 12-1971.

*Primary Examiner*—Neil Abrams
*Attorney, Agent, or Firm*—Katherine A. Nelson

[57] ABSTRACT

An integrally molded electrical connector 10 for interconnecting an array 60 of conductors of a first article 58 with a corresponding array 64 of conductors of a second article 62 includes a plurality of substantially rigid bifurcated tines joined by a bight section 30, each tine having arm portions 18, 24 deflectable toward each other; and compressible support means 46 extending between the arm portions 18, 24 of the tines 16; and continuous circuit means 36 defined along outer surfaces of tine arm portions 18, 24 and bight section 30. The array of tines is formed from a dielectric material. The compressible support means 46 has sufficient durometer to maintain contact normal force between the continuous circuit means 36 and the corresponding contact means of opposed first and second electrical articles 58, 62 upon the arm portions 18, 24 being compressively held between the pair of electrical articles 58, 62.

15 Claims, 5 Drawing Sheets

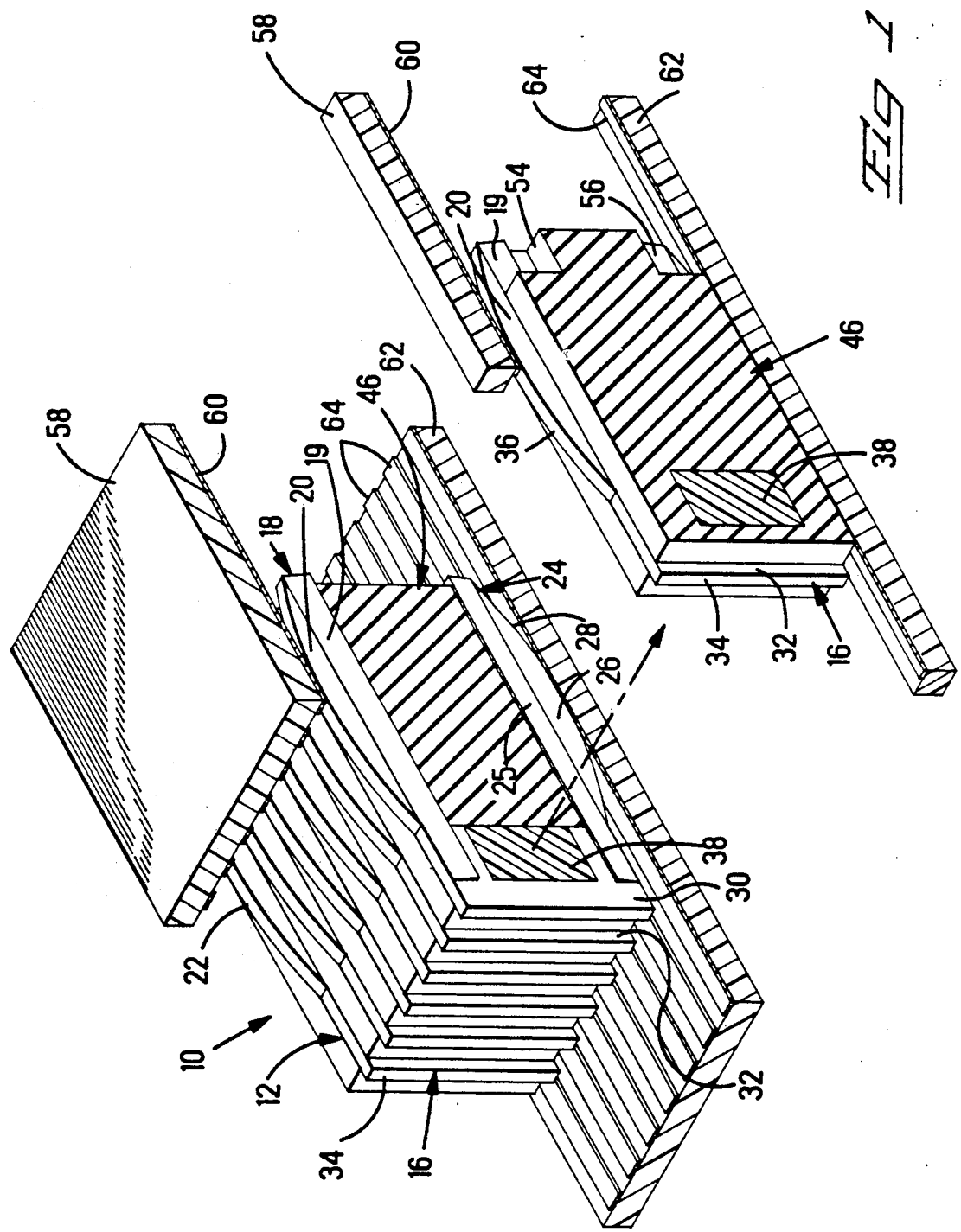

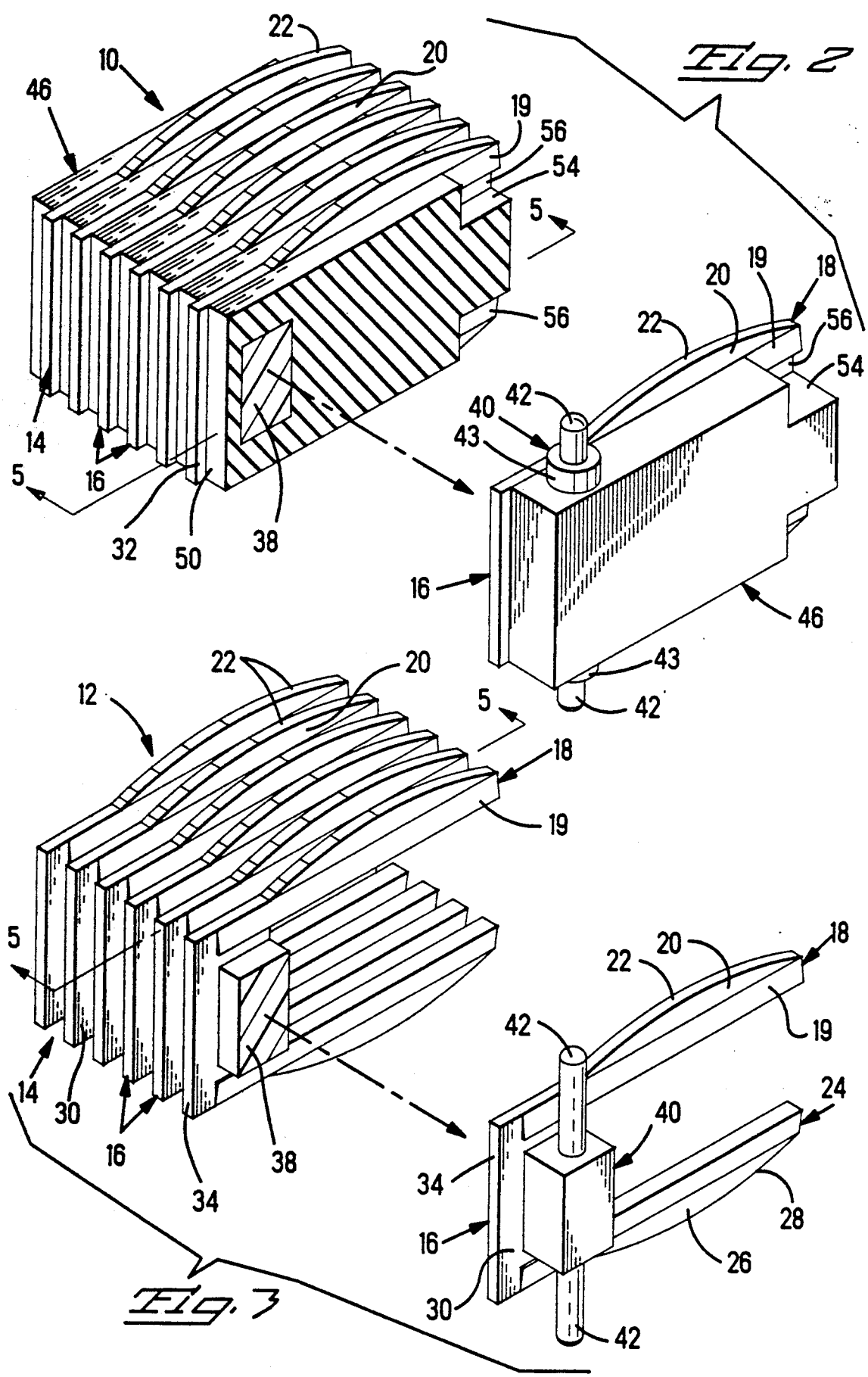

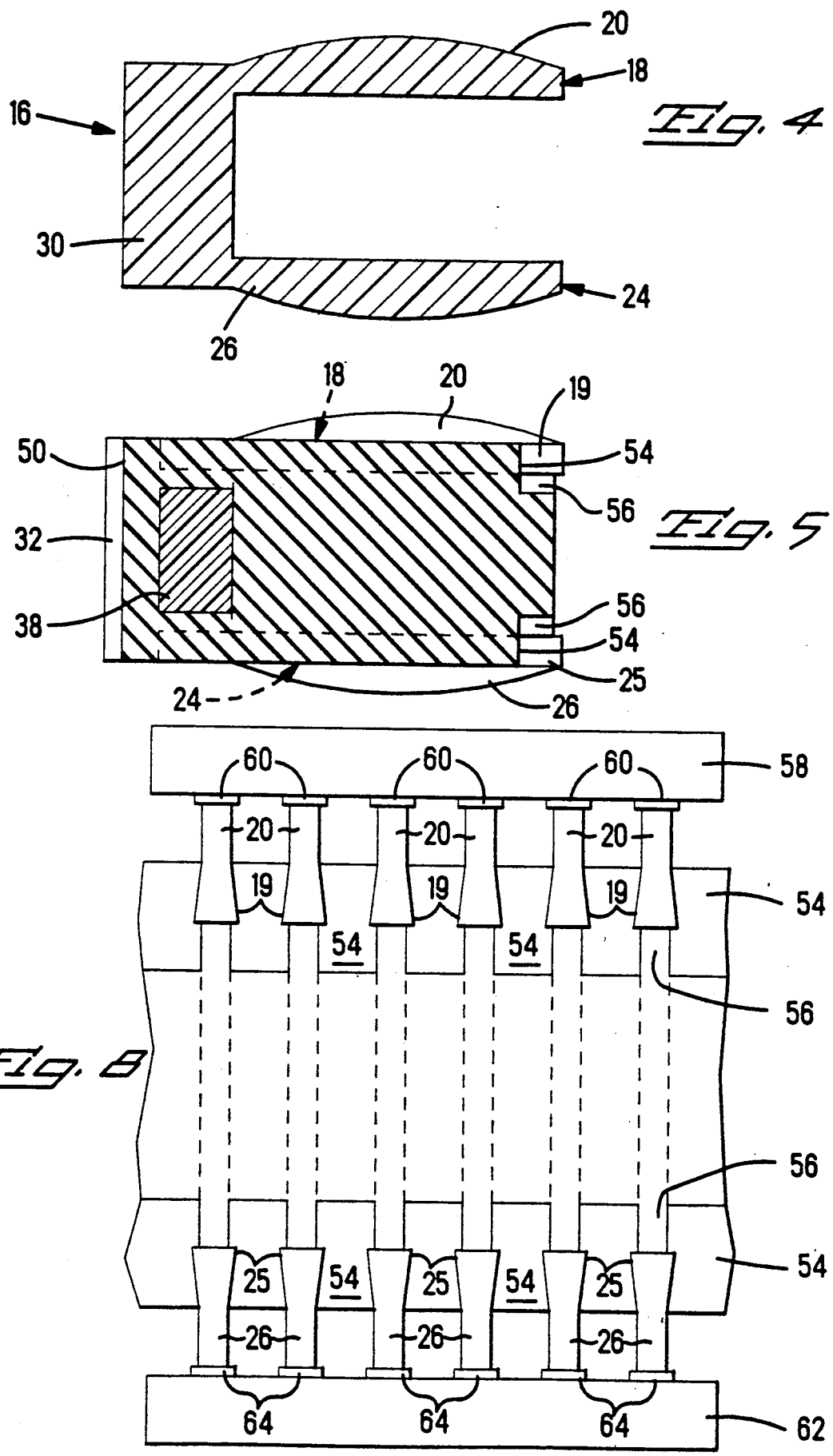

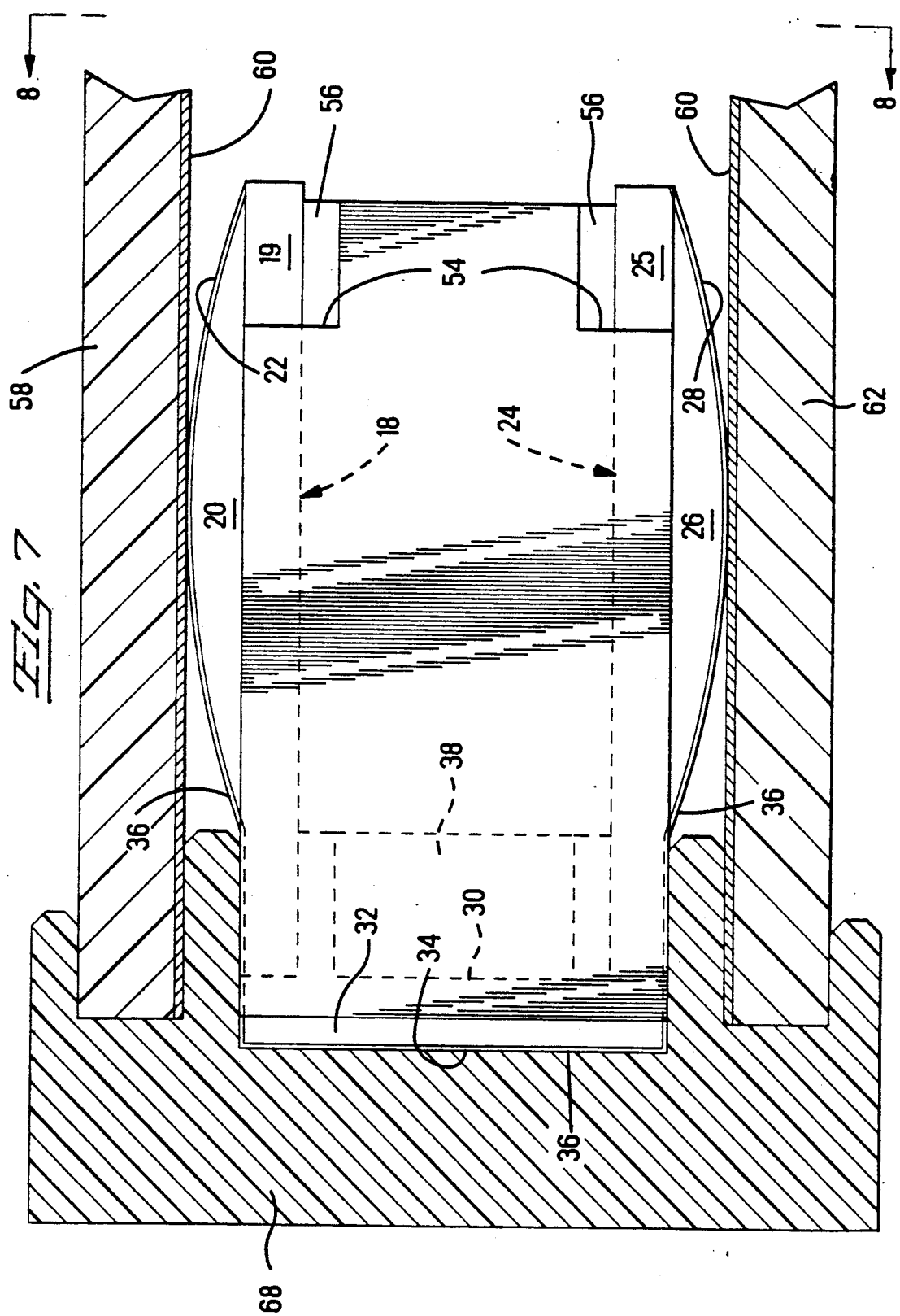

MULTICIRCUIT CONNECTOR ASSEMBLY

RELATED APPLICATIONS

This application is a continuation-in-part of U.S. patent application Ser. No. 07/407,762, filed Sept. 19, 1989.

FIELD OF THE INVENTION

The present invention is directed to electrical connectors and in particular to connectors having capability of electrically interconnecting circuitry between opposed parallel surfaces.

BACKGROUND OF THE INVENTION

There is an increasing need for multi-circuit packages for use with electronic assemblies and in the computer industry. As both complexity and miniaturization increases, the need for smaller size, lighter weight packaging and reliability has generated the need for connectors having the ability to reliably connect a large number of electrically conductive traces on closely spaced centerlines in compact areas and particularly between circuitry on parallel surfaces, such as between stacked circuit boards. The requirements of the industry have generated a class of connectors known as elastomeric connectors which can be disposed between circuitry on, for example, a printed circuit board and a glass panel to interconnect corresponding circuits while avoiding the use of solder. The elastomeric member provides sufficient normal force to maintain the electrical interconnection of the circuits yet the member has sufficient compliancy so as not to damage the glass or other panels.

U.S. Pat. No. 4,820,170 discloses one such layered elastomeric connector in which succeeding layers of dielectric material and conductive material are alternated so as to provide a plurality of closely spaced but electrically isolated conductive areas. Typically the elastomeric connector is a rectangular block such that each layer is exposed on all four sides of the block, thus enabling interconnection between circuits on parallel planes or between circuits on planes that meet at essentially right angles. Since the elastomeric connector is compressible and will expand outwardly when subjected to pressure, means must be provided to support the elastomeric block in order to control the direction of expansion and maintain the block in appropriate alignment and to provide dimensioned stability for the block. In using such an elastomeric connector, therefore, a separate support housing or a special cavity within a connector housing is required. These additional parts for providing interconnection add to the number of pieces that must be molded or otherwise formed in order to achieve and maintain the desired interconnection.

U.S. patent application Ser. No. 07/407,762 discloses a panel mounted assembly adapted for interconnecting an electronic package to circuitry on glass panels and the like. The assembly includes a molded electrical connector having a plurality of compliant spring fingers molded integrally with a body portion, the spring fingers including contact means on surface portions that are exposed to be engaged by a mating article. The spring fingers are electrically engageable upon assembling the connector to a corresponding electrical connector having corresponding contact means that are engageable with the compliant spring fingers. The assembly further includes a molded resilient material that provides support for the compliant spring portions and substantial resistance to compression to minimize stress on the corresponding compliant spring portions, thereby resisting the tendency of the polymeric material to "creep" and "stress relax."

When interconnecting circuitry between parallel surfaces, such as in a stacked array of circuit boards, it is generally desirable to have a minimum of space between adjacent boards while maintaining sufficient normal force to assure electrical continuity.

It is also desirable to provide a means for electrical interconnection that requires a minimum of parts.

It is additionally desirable to have an interconnection means that will not damage the surfaces of circuit boards and the like.

It is further desirable to minimize the steps in manufacturing such an assembly.

It is also desirable to have an assembly that is relatively lightweight and compact while maintaining the desired electronic capabilities of the more complex prior art devices.

SUMMARY OF THE INVENTION

Accordingly, the present invention is directed to a multicircuit connector that alleviates the disadvantages and problems of the prior art. The assembly includes a molded electrical connector having an array of spaced bifurcated tines, each said tine having first and second arm portions coextending from a bight section and deflectable toward each other and compressible support means extending between the arm portions of each tine of the array. Each arm portion of the array includes a respective contact area on an outer surface thereof. A continuous conductive path extends along the outer surface of each bifurcated tine interconnecting the respective contact areas thereof. The support means has sufficient durometer to maintain contact normal force between the contact areas on respective arm portions and the corresponding contact means of opposed first and second electrical articles upon the respective arm portions being compressively held between a pair of electrical articles. The array of tines and support means therebetween thereby define a multiconductor article for interconnecting opposed arrays of corresponding contact means of first and second electrical articles.

In the preferred embodiment the arm portions of the bifurcated tines are curved arcuately outwardly. The array of bifurcated tines are molded from a relatively rigid dielectric material. Preferably a portion of the bight section forms a carrier strip which interconnects adjacent tines thereby establishing the desired spacing between the contact areas of the array. The compressible support material is preferably an elastomeric material having a durometer in the range of 35–60 Shore A. The support material extends between and along the bifurcated tines and bight section such portions of the tines including the carrier strip of the bight section are encased within by the compliant support material. A continuous conductor extends along the outer elongated surface of the arm portions and the intervening bight section such that the connector has an array of essentially parallel circuits extending along three sides thereof. The connector provides interconnection between corresponding circuit arrays on two essentially parallel members, the arms of respective tines are deflectable toward each other as the connector is compressed between the parallel surfaces. The support material also provides substantial resistance to compression to minimize stress on the corresponding arm portions, and resist the tendency of the polymeric material to "creep" and "stress relax."

Preferably the more rigid tine and carrier strip portion and the resilient portion are molded according to dual injection molding techniques wherein the first material is formed into a first predetermined body shape, core pins within the mold are then adjusted to define a second mold cavity at the desired location of the first body shape and the second or resilient material is injected into the second cavity of the mold. The dual injection molding technique is a cost effective method for providing an integral elastomeric type connector. Alternatively the connector may be made in a two step molding procedure.

It is an object of the present invention to provide a means for making multicircuit electrical connectors having a minimum number of parts.

It is another object of the invention to provide a molded connector member that maintains electrical interconnections even at elevated temperatures.

The invention itself, together with further object and attendant advantages of the invention will be best understood by reference to the following detailed description, taken in conjunction with the accompanying drawings.

BRIEF DESCRIPTION OF THE DRAWING

FIG. 1 is a fragmentary partially exploded perspective view of the connector of the present invention electrically interconnecting corresponding arrays of conductors on two circuit boards;

FIG. 2 is a view similar to that of FIG. 1 with the circuit boards removed and further illustrating mounting means for the connector of the invention between the circuit boards;

FIG. 3 is a perspective view of the first molded portion of the connector illustrating an array of bifurcated tines integrally joined along a carrier strip with an end tine including mounting means exploded therefrom;

FIG. 4 is a cross sectional view of a single bifurcated tine taken along the line 4—4 of FIG. 3;

FIG. 5 is a longitudinal sectional view taken along line 5—5 of FIG. 2, illustrating the location of the second material molded over the portion of FIG. 3.

FIG. 7 is a longitudinal section view of the connector of the present invention disposed in a housing and interconnecting arrays of conductors along the edges of two circuit boards; and FIG. 8 is a cross sectional view of the connector of FIG. 7, taken along line 8—8 of FIG. 7.

DETAILED DESCRIPTION OF THE PREFERRED EMBODIMENT

Figure 6:
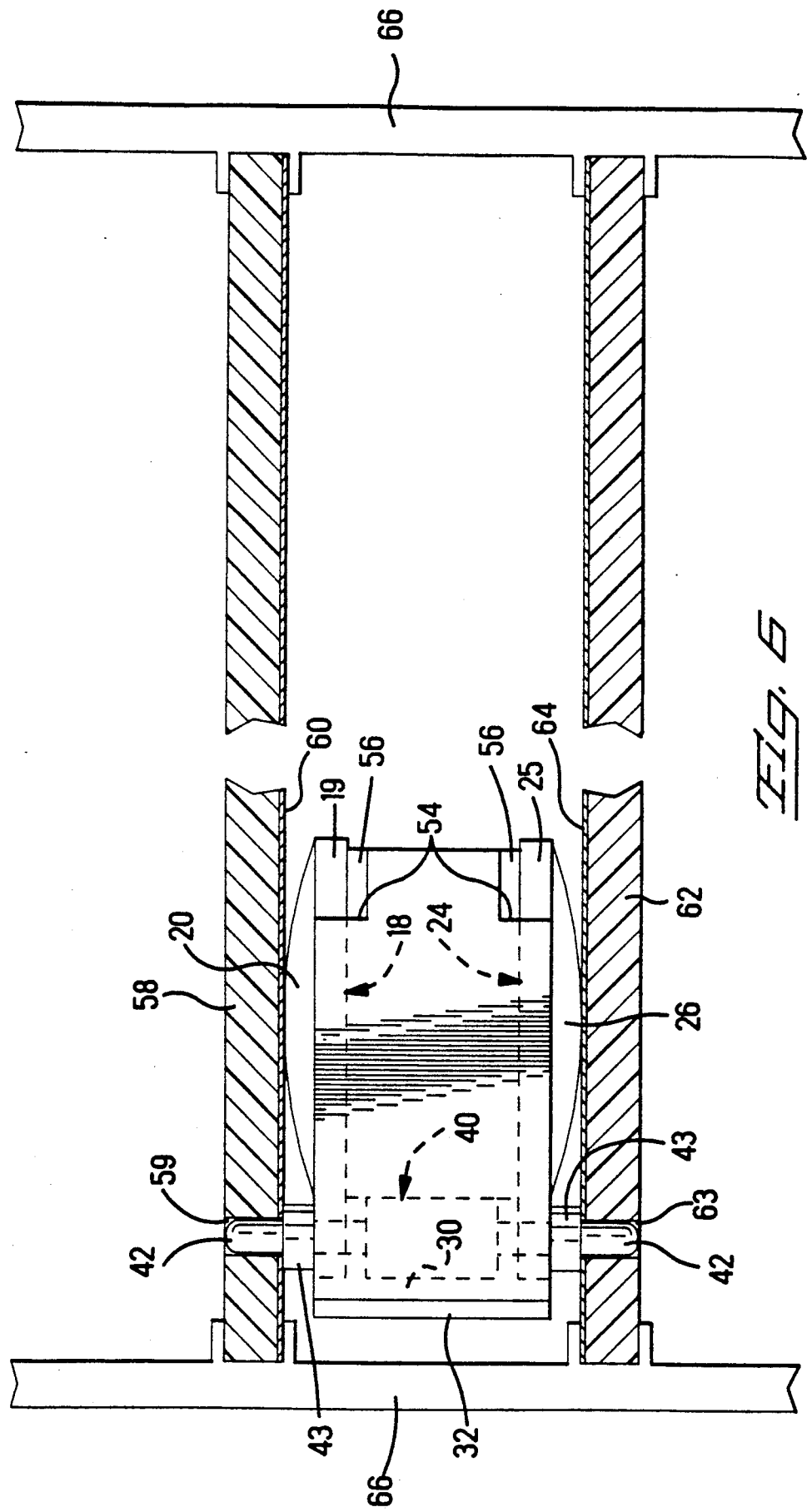
FIG. 6 is a longitudinal section view of a pair of stacked circuit boards secured in a frame with circuits of the boards interconnected by the connector of the invention.

FIG. 1 illustrates connector 10 of the present invention. Referring now to FIGS. 1-5 connector 10 comprises first and second sections 12, 46 disposed between two circuit boards 58, 62 and electrically interconnecting corresponding arrays 60, 64 respectively thereof. FIG. 2 shows connector 10 with circuit boards 58, 62 removed. The exploded end portion of connector 10 in FIG. 2 also shows representative mounting means 40 for mounting connector 10 between circuit boards 58, 62 as shown in FIG. 6. As best seen in FIG. 3, first section 12 includes a plurality of bifurcated tines 16 having first and second arms 18, 24 deflectable toward each other and extending from bight section 30. Arms 18, 24 are preferably are curved arcuately outward thereby defining a respective beam portions 20, 26. Second portion or compressive support means 46, as seen in FIGS. 1 and 2, extends between deflectable first and second arms 18, 24. In the preferred embodiment side surfaces 19, 25 of arms 18, 24 respectively flare slightly outwardly as shown in FIGS. 3 and 8, to provide a wider surface area for engaging the respective support means 46. Outer surfaces 22, 28 of respective arms 18, 24 and respective outer surface portions 34 of bight section 30 include respective continuous conductive surface extending therealong defining an array 14 of conductors 36 for interconnecting to corresponding conductor arrays 60, 64 on circuit boards 58, 62.

As shown in FIG. 4, the tine units 16 of first portion 12 include arms 18, 24 and bight section 30. As best seen in FIG. 3, bight section 30 further includes an inner body portion which extends longitudinally between adjacent tines 16 thereby defining a carrier strip 38 for the plurality of bifurcated tines 16. First section 12 of connector is preferably molded in a continuous strip from a rigid thermoplastic material suitable for use in the desired operating conditions for the connector. Depending upon the end use of connector 10, mounting means 40 may be molded integrally with first section 12. In the embodiment shown mounting means 40 includes outwardly extending pin type protrusions 42, which cooperate with apertures 59, 63 in circuit boards 58, 62 respectively, as shown in FIG. 6 to align connector 10 between the boards. It is to be understood that the configuration of mounting means 40 is for illustrative purposes and that the mounting means may have other geometric configurations. Preferably the material used for first portion 12 should be sufficiently rigid to provide support for connector 10 without the need for a separate housing member, yet be sufficiently resilient for arms 18, 24 to be deflectable when subjected to compression forces during use. The skeletal structure of first portion 12 is suitable for connectors requiring conductors having centerlines as close as 0.13 centimeters (0.05 inches). In a preferred embodiment for conductors having centerlines of 0.13 centimeters, the width of each tine is 0.05 centimeters (0.020 inches) and the tines are spaced 0.08 centimeters (0.03 inches) apart.

Referring now to FIGS. 1, 2, and 5, second connector section 46 extends along and between outwardly extending arms 18, 24 of each bifurcated tine 16 to provide compressive support therebetween and extends between adjacent tines 16 to provide electrical insulation as well as structural support. Second connector section 46 is preferably molded around first section 12 such that the flared side surfaces 19, 25 of arms 18, 24 respectively are partially captivated in the elastomeric material and the outermost portions of section 12 including arcuate sections 20, 26 of arms 18, 24 are exposed above and below support member 46. Support member 46 also preferably surrounds carrier portion 38 such that a small portion 32 of bight section 30 is exposed along the outer edge of connector 10, as shown generally in FIGS. 1 and 2 and best seen in FIGS. 5 and 6. The broken lines in FIG. 6 indicate the innermost edges of arms 18, 24 of tine 16, which have been partially surrounded by support member 46. As shown in FIGS. 2 and 6, second section 46 also includes members 43 on pin members 42 of mounting means 40, which act as elastomeric spacers between connector 10 and circuit boards 58, 62. It is important that the material used for support member 46 be of sufficient durometer to maintain the desired contact force between the opposed arrays. Preferably the compressible support material is an elastomeric material having a durometer in the range of 35–60 Shore A. It is to be understood that the rigid and compressible materials selected for the connector 10 need to be balanced with the design of the connector such that the desired normal forces are maintained between the electrically interconnected conductor arrays.

When using connector 10 between stacked circuit boards 58, 62 as shown in FIGS. 1 and 6–8, connector 10 may be mounted between two boards that are held in a frame, shown representatively as frame 66 in FIG. 6 or may be inserted into a card edge connector housing shown representatively as member 68 in FIG. 7. FIG. 7 also shows continuous conductor 36 which extends along surfaces 22, 34, and 28 of arm 18, bight 30 and arm 24 respectively. The typical normal force required between arrays of conductors on stacked circuit boards is 150 grams. It is to be understood that the configuration of the framework 66 used to support the boards and housing member 68 are for illustrative purposes only.

In forming the one piece connector 10, the first dielectric portion 12 is molded as an integral and unitary framework or skeletal structure having the desired length and end structure, shown representatively herein as member 40 having protrusions 42. The material used for forming the skeletal structure needs to have sufficient rigidity to provide structural support for the elastomeric member but have sufficient resiliency to allow outwardly extending arms 18, 24 to flex under pressure. A number of polymeric materials can be used for the basic skeletal member, such as for example polyetherimide sold under the trade designation ULTEM by GE Plastics, Pittsfield, Mass. and polybutylene terephthalate sold under the trade designation VALOX by GE Plastics.

The second material is then molded around the skeletal structure or framework of the first portion 12. In forming compliant arms or beams from plastic materials, it is important that the plastic spring member not creep under load or lose the desired spring characteristics. To overcome any tendency of the spring to relax and to provide constant normal force, it is preferable that resilient member 46 be made from an elastomeric material such as a dynamic vulcanize or a silicone rubber. One suitable material for the dynamic vulcanize is Santoprene available from Monsanto Products Company. Santoprene comprises ethylene-propylene-diene monomer (EPDM) rubber particles dispersed in a matrix of polypropylene. Santoprene has a Shore A value in the range of 50–55. Since the basic molded members are typically made from thermoplastic materials, the tendency of the spring arm members to creep and relax under stress increases as the operating or environmental temperature increases. The use of a resilient member 46 that has a higher softening point than the typical molding materials used for the molded member 12 continues to provide the necessary support and normal force to the plastic spring arms members thus permitting connector 10 to be used in elevated temperatures. It is to be understood that the operating temperature is one factor that must be considering for molding connector portions 12, 46. For example, the Santoprene material has an upper temperature limit of about 125° C. while the upper temperature limit for silicone rubbers is about 200° C. The Shore a value for silicone rubbers is in the range of 30–65.

Connector 10 is preferable formed in a dual injection molded process wherein after the forming of a first material into a first desired shape, one or more core pins are moved within the mold to form an additional cavity or cavities for accepting a second material. This process is described more fully in U.S. patent Ser. No. 06/862,902. In making connector 10 of the present invention, skeletal structure 12 is formed with the mold in the first position and the second or elastomeric portion 46 is formed with the mold in the second position. For the embodiment shown, the end of the movable core pin (not shown) has a squared "U" shape, the three sides of which form the shape of the upper, innermost and lower surfaces of carrier strip 38. Upon moving the core pin to form the second cavity a similar squared "U" shape is formed along the innermost edge of elastomeric member 46. Owing to the shape of the end of the movable core pin adjacent the two cavities, elastomeric section 46 includes notches 54 formed by the legs of the "U" in the elastomeric portions extending between adjacent tines 16. Webs 56 of elastomeric material remain between the ends of arms 18, 24, as best seen in FIG. 1. While a dual injection molding process is preferred, the two members can also be formed by using two separate molds.

After molding connector 10, the conductive material of the continuous circuit paths is plated in the desired locations such as by electroless plating techniques as disclosed in U.S. Pat. Nos. 3,629,185; 3,907,621; 3,930,963; 3,993,802; 3,994,727; 4,287,253; 4,511,597; and 4,594,311 and European Patent Application No. 861020550 owned by Kollmorgen Corporation; or by a combination of electroless/electroplating such as disclosed in U.S. Pat. No. 3,042,591; or as disclosed in U.S. Pat. Nos. 4,532,152 or 4,604,799. Typically the processes include treating all exposed surface portions of the molded member for adhesion promotion and coating the surfaces with an ultraviolet light sensitive catalyst as described in U.S. Pat. No. 4,511,597. A masking means opaque to ultraviolet light is then placed over all surfaces of the molded plastic member, which are intended to remain non-conductive. All unmasked surfaces of the catalyzed and masked plastic member are exposed to ultraviolet light of appropriate actinic wavelength and energy level to activate the catalyst on the exposed surface areas to render the catalyst on the exposed surface areas to render the catalyzed areas receptive to plating of a metal layer thereonto. The masking means is then removed. The catalyst-activated areas are plated such as by electroless plating, or electroplating or a combination thereof, with a first plating layer being a copper layer about 0.0014 inches thick. A layer of the desired metal about 0.0002 inches thick is then plated onto the copper layer. The plated member thus formed may then be subjected to baking or other post-curing restoration steps and cleaning steps if desired. The metal selected will depend upon how the connector is to be used. If the connector will be mating tin conductors, a layer of tin will be deposited on the copper. If the connector will be used to mate precious metal conductors, a layer of nickel will be deposited on the copper and precious metal will preferably be selectively plated on the contact areas only.

Alternatively, the adhesion-promoted plastic member may be selectively coated with plating resist by conventional means, and the exposed areas then electrolessly plated with commercially available plating chemistry. The resist is then removed such as with solvent. Baking or other post-curing restoration steps and cleaning steps may optionally be utilized. Other methods as known in the art may also be used to dispose circuitry on the molded member.

The present invention provides a compact structure for an electrical connector and one that is cost effective to manufacture. The connector includes a skeletal structure sufficient to support an integrally formed elastomeric portion, thereby eliminating the need for separate additional structures to support the elastomer.

Accordingly, it will be appreciated by those skilled in the art that the improved multicontact connector of the present invention provides both compactness and miniaturization while facilitating cost effective production methods.

It is thought that the connector of the present invention and many of its attendant advantages will be understood from the foregoing description. Changes may be made in a form, construction and arrangement of parts thereof without departing from the spirit and scope of the invention or sacrificing all of its material advantages.

We claim:

1. An electrical connector for interconnecting a pair of electrical articles said connector being integrally molded from rigid and compressible materials by a dual injection molding process, said connector comprising:
    at least one bifurcated substantially rigid tine having first and second arm portions coextending from a bight section and deflectable toward each other said arm portions being curved arcuately outwardly, and adapted to have circuit means defined along outer surfaces thereof, said tine being formed from a dielectric material;
    support means integrally molded between said first and second arm portions, said support means being formed from said compressible material; and
    continuous circuit means defined along outer surfaces of said arm and bight portions respectively of said molded member, said circuit means including first and second contact sections on said first and second arm portions respectively adapted to engage respective corresponding contact means of said pair of articles, said compressible material having sufficient durometer to maintain contact normal force between said first and second contact sections and the corresponding contact means of opposed first and second electrical articles upon said arm portions being compressively held between said pair of electrical articles.

2. The electrical connector of claim 1 wherein said compressible support means is an elastomeric material having a durometer in the range of 35-60 Shore A.

3. An assembly comprising the electrical connector of claim 1 disposed in a housing member, said housing being adapted to receive first and second electrical articles therein, said articles being electrically connected by said continuous circuit means of said arm and bight portions.

4. An assembly comprising first and second electrical articles interconnected by the electrical connector of claim 1.

5. A multiconductor electrical connector for providing a plurality of electrical interconnections between respective conductive portions of first and second electrical articles, said connector being integrally molded from rigid and compressible materials by a dual injection molding process, said connector comprising:
    an array of spaced bifurcated substantially rigid tines, each said tine having first and second arm portions coextending from a bight section and deflectable toward each other, said arm portions being curved arcuately outwardly and adapted to have circuit means defined along outer surfaces thereof, said tines being formed from a dielectric material;
    support means integrally molded between said first and second arm portions, and securing said array of tines together to define an integrally molded member having precisely dimensioned and exposed outer rigid surfaces having arcuate portions, said support means being formed from said compressible material; and
    continuous circuit means defined along respective outer surfaces of each of said first and second arm and bight portions respectively of said molded member, said circuit means including first and second contact sections on respective said first and second arm portion adapted to engage respective corresponding contact means of said pair of articles, said support means having sufficient durometer to maintain contact normal force between said first and second contact areas and the corresponding contact means of opposed first and second electrical articles upon said arm portions being compressively held between said pair of electrical articles, said support means thereby defining a multiconductor connector for interconnecting opposed arrays of said corresponding contact means of said first and second electrical articles.

6. The electrical connector of claim 5 wherein said arm portions of said bifurcated tines are curved arcuately outwardly.

7. The electrical connector of claim 5 wherein said compressible support means is an elastomeric material having a durometer in the range of 35-60 Shore A.

8. The electrical connector of claim 5 wherein said array of bifurcated tines are spaced along a continuous carrier strip.

9. The electrical connector of claim 5 further including means for mounting said connector between first and second electrical articles.

10. An assembly comprising the electrical connector of claim 5 disposed in a housing member, said housing being adapted to receive first and second electrical articles therein, said first and second articles including first and second arrays of contact means respectively, said first and second arrays being electrically interconnected by said continuous circuit means of said arm and bight portions.

11. An assembly comprising first and second electrical articles interconnected by the electrical connector of claim 5.

12. A method for making a multiconductor electrical connector for providing a plurality of electrical interconnections between respective conductive portions of opposed first and second electrical articles, comprising:
    molding an array of spaced bifurcated substantially rigid tines, each said tine having first and second arm portions coextending from a bight section and deflectable toward each other, said array of tines being molded from a dielectric material;

molding integral support means between said first and second arm portions of each of said tines of said array and securing said array of tines together, said support means being formed from compressible material and integrally molded by a dual injection molding process to define an integral molded member having precisely dimensioned and exposed outer rigid surfaces having arcuate portions; and defining continuous circuit means along respective exposed outer surfaces of each of said first and second arm and bight portions respectively of said molded member, said circuit means including first and second contact sections on said first and second arm portions, respectively, adapted to engage respective corresponding contact means of said pair of articles, said support means having sufficient durometer to maintain contact normal force between said first and second contact areas of the corresponding contact means of opposed first and second electrical articles upon said arm portions being compressively held between said pair of electrical articles.

13. The method of claim 12 wherein said array of bifurcated tines are provided by molding a plurality of tines along a carrier strip.

14. The method of claim 12 wherein said compressible support means is provided by molding an elastomeric material around the desired areas of said array of tines.

15. The method of claim 12 wherein said array of tines and said compressible support means are integrally formed by a dual injection molding process.

* * * * *